(12) United States Patent
Ebihara et al.

(10) Patent No.: US 9,306,532 B2
(45) Date of Patent: Apr. 5, 2016

(54) FILTER CIRCUIT

(71) Applicant: TAIYO YUDEN CO., LTD., Tokyo (JP)

(72) Inventors: Hitoshi Ebihara, Tokyo (JP); Hiroshi Hara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 656 days.

(21) Appl. No.: 13/658,493

(22) Filed: Oct. 23, 2012

(65) Prior Publication Data

US 2013/0194142 A1    Aug. 1, 2013

(30) Foreign Application Priority Data

Jan. 26, 2012    (JP) .................................. 2012-013737

(51) Int. Cl.
| | |
|---|---|
| H05K 1/16 | (2006.01) |
| H05K 1/03 | (2006.01) |
| H01Q 1/00 | (2006.01) |
| H03H 7/38 | (2006.01) |
| H03H 1/00 | (2006.01) |
| H01P 1/203 | (2006.01) |
| H03H 7/46 | (2006.01) |

(52) U.S. Cl.
CPC .............. *H03H 7/38* (2013.01); *H01P 1/20345* (2013.01); *H03H 1/0007* (2013.01); *H03H 7/463* (2013.01); *H05K 1/165* (2013.01)

(58) Field of Classification Search
CPC ..... H03H 9/6433; H03H 9/706; H03H 9/725; H03H 7/38
USPC .................................................. 333/193, 133
See application file for complete search history.

(56) References Cited

U.S. PATENT DOCUMENTS

| | | | |
|---|---|---|---|
| 2004/0207486 A1* | 10/2004 | York | .................. H03H 7/0153 333/171 |
| 2005/0070332 A1 | 3/2005 | Yamato | |
| 2007/0090895 A1* | 4/2007 | Nishizawa et al. | ............ 333/133 |
| 2010/0188166 A1* | 7/2010 | Hara et al. | ..................... 333/133 |
| 2012/0119847 A1* | 5/2012 | Iwaki et al. | ..................... 333/133 |
| 2013/0113576 A1* | 5/2013 | Inoue | .................. H03H 9/6433 333/133 |

FOREIGN PATENT DOCUMENTS

| | | |
|---|---|---|
| EP | 2 416 496 A1 | 2/2012 |
| JP | 2005-124139 A | 5/2005 |
| WO | 2010/116776 A1 | 10/2010 |

* cited by examiner

*Primary Examiner* — Stephen E. Jones
*Assistant Examiner* — Scott S Outten
(74) *Attorney, Agent, or Firm* — Chen Yoshimura LLP

(57) ABSTRACT

A filter circuit includes: a filter element having a first terminal connected to an antenna, a second terminal connected to a receiving circuit, and a third terminal connected to a transmission circuit; a first inductor, a second inductor, and a third inductor connected in series between the first terminal and the third terminal of the filter element; a fourth inductor that has one end connected to a connecting node connecting the first inductor and the second inductor and that has the other end grounded; and a fifth inductor that has one end connected to a connecting node connecting the second inductor and the third inductor and that has the other end grounded.

3 Claims, 19 Drawing Sheets

FILTER CIRCUIT

This application claims the benefit of Japanese Application No. 2012-013737, filed in Japan on Jan. 26, 2012, which is hereby incorporated by reference in its entirety.

BACKGROUND OF THE INVENTION

1. Field of the Invention

The present invention relates to a filtering technology in a front end module of a wireless communication device.

2. Description of Related Art

In wireless communication devices, reduction in size of a front end module including a duplexer is sought after. In order to achieve the size reduction, some of the components provided in the module are formed inside a substrate. However, it is difficult to form a capacitor or an inductor inside the substrate when it has a large element value.

A front end module as shown in FIG. 1, for example, has been traditionally used. In the front end module shown in FIG. 1, one end of an inductor L101 (2.2 nH, for example) is connected to a terminal 1 of an SAW (Surface Acoustic Wave) duplexer 1001, which is connected to an antenna (ANT), and the other end of the inductor L101 is grounded. One end of an inductor L100 (4.9 nH, for example) is connected to a terminal 2 of the SAW duplexer 1001, which is connected to a transmission circuit, and the other end of the inductor L100 is grounded. Between a terminal 3 and a terminal 4 of the SAW duplexer 1001, which are connected to a receiving circuit, an inductor L102 (8.2 nH, for example) and the primary coil of a transformer T101 are connected in parallel. One end of the secondary coil of the transformer T101 is grounded, and the other end thereof is connected to another circuit. Terminals 5 and 6 of the SAW duplexer 1001 are grounded. The inductors L100 and L101 are matching elements.

FIG. 2 shows frequency characteristics of this front end module. In FIG. 2, the frequency characteristics at the transmitting terminal (TX) and the frequency characteristics at the receiving terminal (RX) are shown. The horizontal axis represents the frequency, and the vertical axis represents the gain. If a wireless communication device is designed to receive through an antenna a signal in the band around 1.5 GHz for GPS (Global Positioning System) and a signal in the band around 2.11 GHz to 2.17 GHz for receiving wireless communication, for example, because the transmission frequency characteristics show excessive gain and the insufficient attenuation amount in the areas indicated with the circles in FIG. 2, a noise that is generated by the transmitting terminal is received by the receiving terminal, resulting in a problem.

Although there exist various conventional technologies with regard to a front end module, a technology that can solve such a problem and that can also achieve the size reduction has not yet been provided.

RELATED ART DOCUMENT

Patent Document

Patent Document 1: Japanese Patent Application Laid-Open Publication No. 2005-124139
Patent Document 2: WO2010/116776

SUMMARY OF THE INVENTION

Thus, an object of the present invention, in one aspect, is to provide a technology that makes it possible to reduce the size of a frond end module that can achieve desired frequency characteristics.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a filter circuit according to the present invention includes: (A) a filter element having a first terminal connected to an antenna, a second terminal connected to a receiving circuit, and a third terminal connected to a transmission circuit; (B) a first inductor, a second inductor, and a third inductor that are connected in series between the first terminal and the third terminal of the filter element; (C) a fourth inductor having one end connected to a connecting node connecting the first inductor and the second inductor, the fourth inductor having the other end grounded; and (D) a fifth inductor having one end connected to a connecting node connecting the second inductor and the third inductor, the fifth inductor having the other end grounded.

By employing such an inductor configuration, even if the inductance values of the second, fourth, and fifth inductors are small, the sufficient attenuation amount can be ensured in desired frequency bands.

In the above-mentioned filter circuit, the second inductor, the fourth inductor, and the fifth inductor may be formed inside a ceramic substrate where the filter element is provided. This makes it possible to further reduce the size of a front end module.

The above-mentioned filter circuit may further include a capacitor that is connected in parallel with the third inductor or in parallel with the first inductor. By adjusting the capacitance value of this capacitor, it becomes possible to make a further adjustment in the desired frequency bands.

The above-mentioned filter element may be a surface acoustic wave filter. In another aspect, a substrate structure for a filter circuit according to the present invention includes: a substrate; a first terminal on the substrate to be connected to the filter and an antenna; a second terminal on the substrate to be connected to the filter and a receiving circuit; a third terminal on the substrate to be connected to the filter and a transmission circuit; a first inductor, a second inductor, and a third inductor, the first, second, and third inductors being connected in series between the first terminal and the third terminal, the second inductor being provided in the substrate, the first and second inductors being provided on the substrate; a fourth inductor in the substrate, the fourth inductor having one end connected to a connecting node connecting the first inductor to the second inductor, and having the other end grounded; and a fifth inductor in the substrate, the fifth inductor having one end connected to a connecting node connecting the second inductor to the third inductor, and having the other end grounded. In the above-mentioned substrate structure, the substrate may be a ceramic substrate. In the above-mentioned substrate structure, the substrate may include a ceramic substrate and a printed circuit board under the ceramic substrate, and the second, fourth, and fifth inductors may be formed in the ceramic substrate.

Circuits described in the following embodiments are examples of possible circuits, and various modifications can be made thereto.

According to one aspect of the present invention, it becomes possible to reduce the size of a front end module that can achieve desired frequency characteristics.

DETAILED DESCRIPTION OF THE PREFERRED EMBODIMENTS

Figure 1:
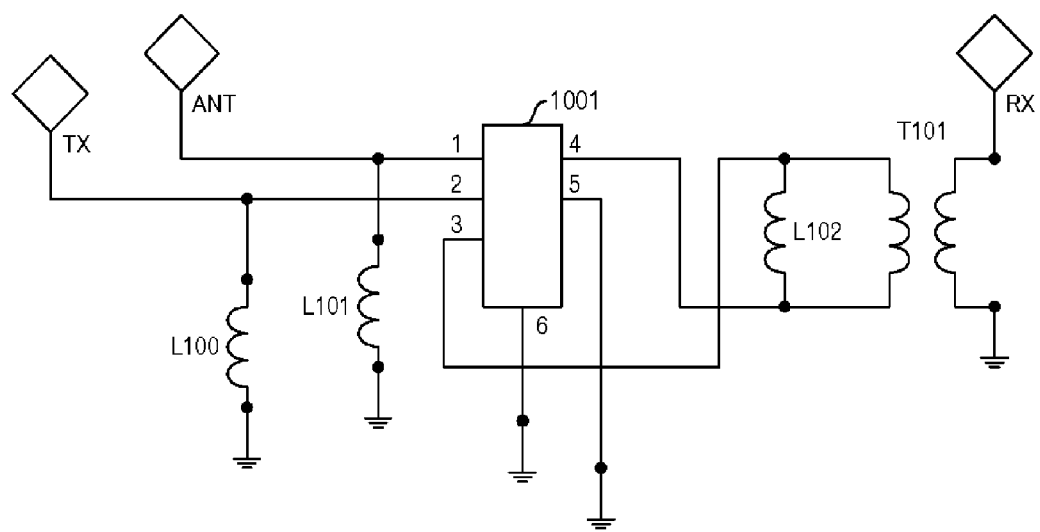
FIG. 1 shows a circuit example of a conventional front end module.
Figure 2:
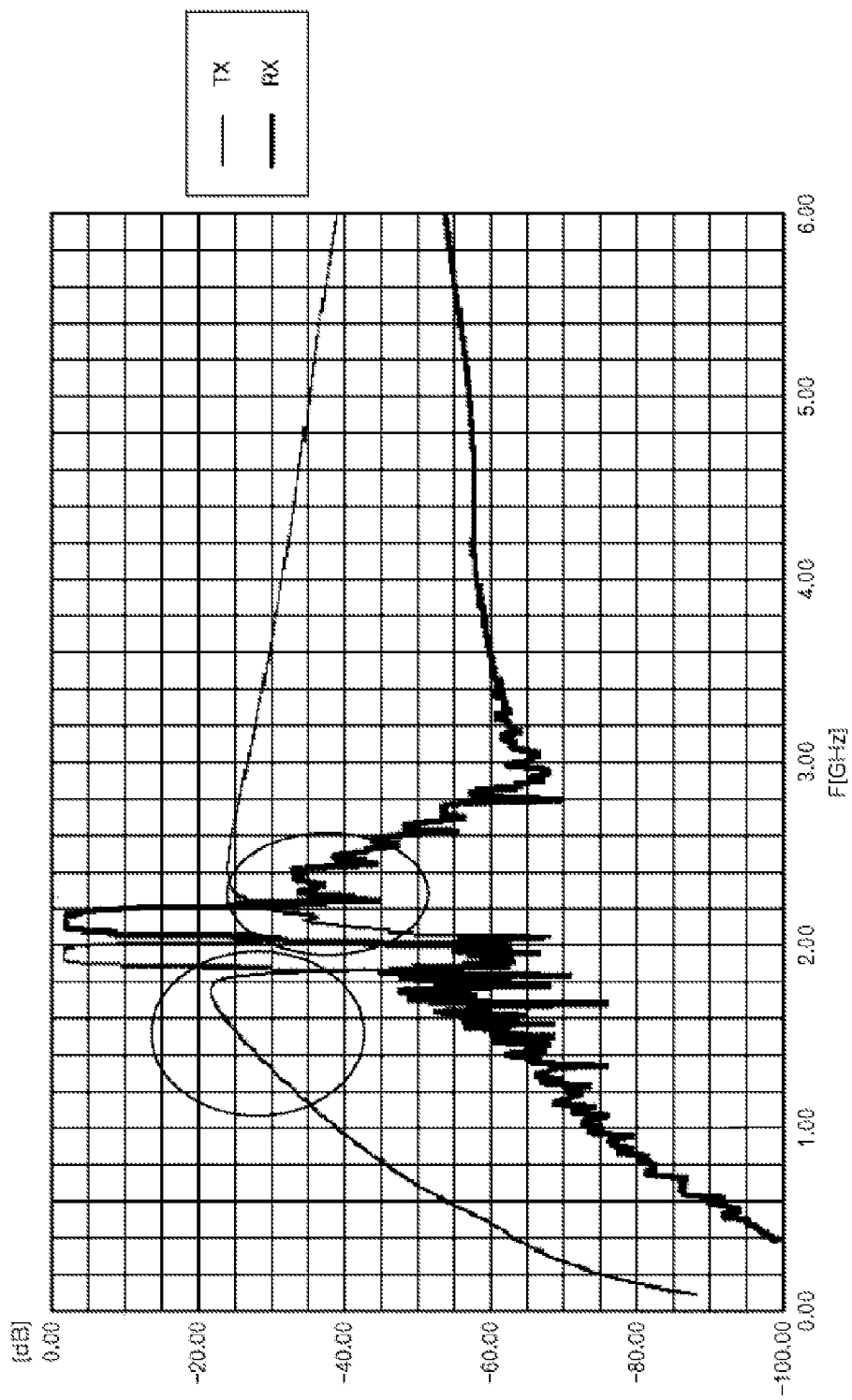
FIG. 2 shows the frequency characteristics of the circuit example of the conventional front end module.
Figure 3:
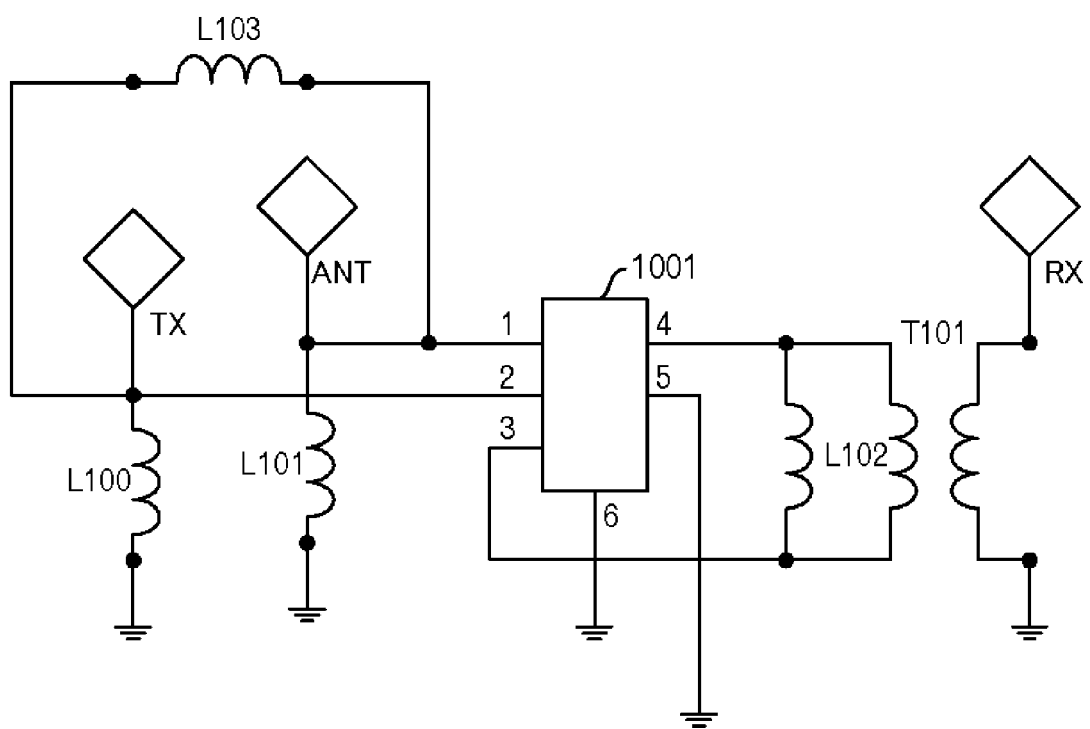
FIG. 3 shows a circuit example of a front end module.
Figure 4:
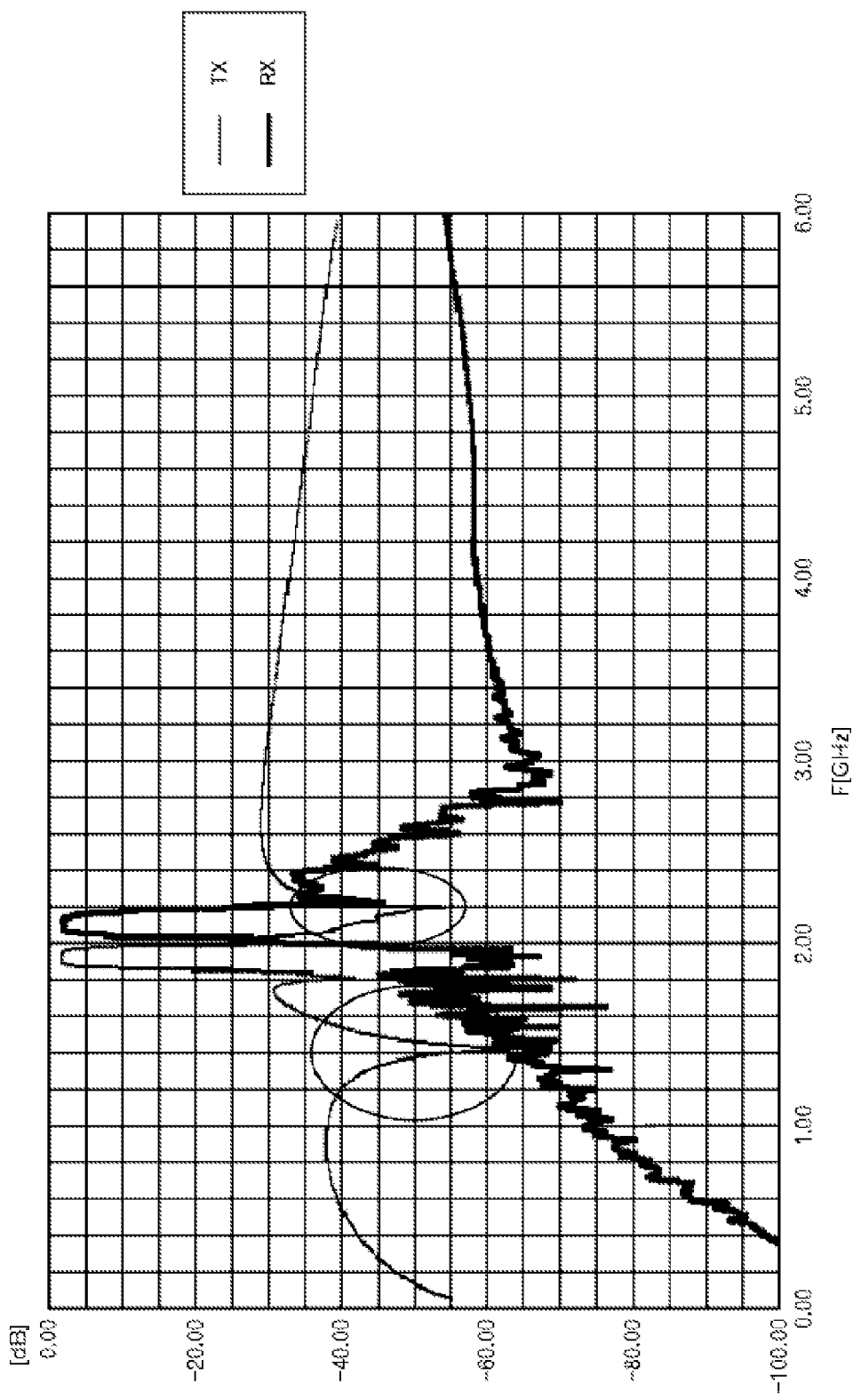
FIG. 4 shows frequency characteristics of the circuit example of the front end module.

Desired frequency characteristics cannot be obtained with the circuit shown in FIG. 1. To solve this problem, a configuration shown in FIG. 3 in which the terminal 1 and the terminal 2 of the SAW duplexer 1001 are connected to an inductor L103 (150 nH, for example) can be employed. With this circuit, the frequency characteristics shown in FIG. 4 are obtained. In a manner similar to FIG. 2, in the example of FIG. 4, the frequency characteristics at the transmitting terminal (TX) and the frequency characteristics at the receiving terminal (RX) are shown. The horizontal axis represents the frequency, and the vertical axis represents the gain. As indicated with the circles in FIG. 4, in the transmission frequency characteristics, the gain in the 1.5 GHz band and the gain in the 2.11 GHz to 2.17 GHz band are sufficiently low. That is, by adjusting the inductance value of the inductor L103 and the like, the gain in the desired frequency bands can be lowered so as not to adversely affect the signal reception. However, in this configuration, if the inductance value of the inductor L103 is reduced to a level that is low enough to allow the inductor to be formed inside the substrate, it would become impossible to reduce the transmission frequency characteristics in the desired frequency bands. This means that the inductor L103 must be mounted as a separate element, which results in an increase in the size of the front end module.

In order to make possible the reduction in size of the front end module that can achieve desired frequency characteristics, the following embodiments are provided.

Embodiment 1

Figure 5:
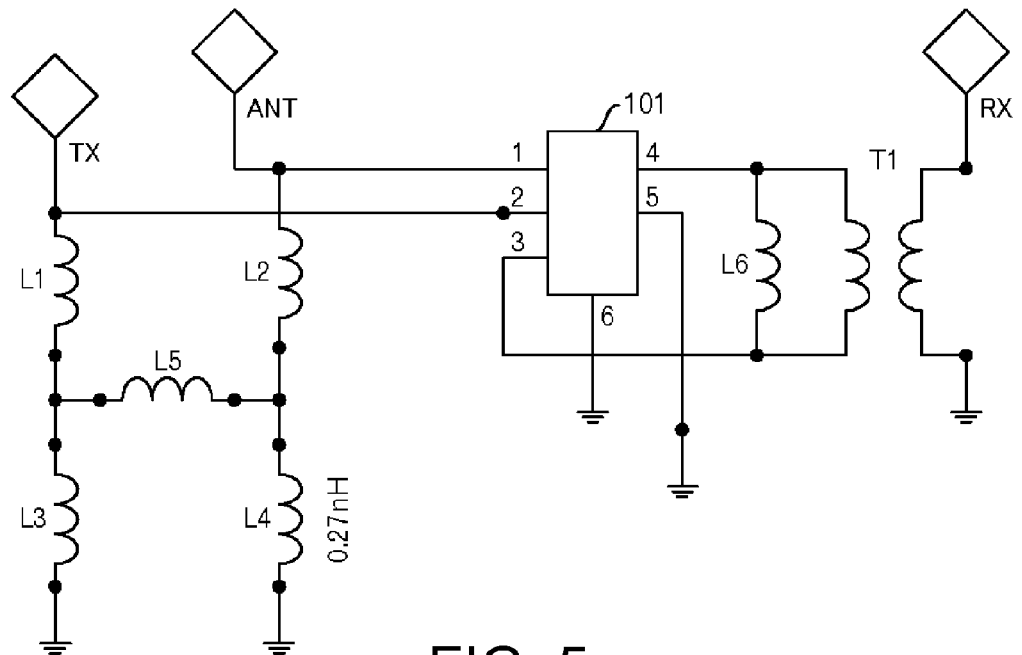
FIG. 5 shows a circuit example according to Embodiment 1.

FIG. 5 shows an example of a circuit of a front end module according to Embodiment 1. One end of an inductor L2 (2.2 nH, for example) is connected to a terminal 1 of an SAW duplexer 101, which is connected to an antenna (ANT), and the other end of the inductor L2 is connected to one end of an inductor L5 (1.7 nH, for example) and one end of an inductor L4 (0.27 nH, for example). The other end of the inductor L4 is grounded.

One end of an inductor L1 (4.9 nH, for example) is connected to a terminal 2 of the SAW duplexer 101, which is connected to a transmission circuit, and the other end of the inductor L1 is connected to the other end of the inductor L5 and one end of an inductor L3 (0.68 nH, for example). The other end of the inductor L3 is grounded.

Between a terminal 3 and a terminal 4 of the SAW duplexer 101, which are connected to a receiving circuit, an inductor L6 (8.2 nH, for example) and the primary coil of a transformer T1 are connected in parallel. One end of the secondary coil of the transformer T1 is grounded, and the other end thereof is connected to another circuit. The terminals 5 and 6 of the SAW duplexer 101 are grounded.

In the above configuration, while the inductors L1 and L2 are not changed from those in the conventional example, the inductors L3, L4, and L5 are provided in place of the inductor of 150 nH. However, the inductance value of the inductor L5 is 1.7 nH, the inductance value of the inductor L3 is 0.68 nH, and the inductance value of the inductor L4 is 0.27 nH, and because of such small inductance values, these inductors can be formed inside a ceramic substrate (LTCC: Low Temperature C0-fired Ceramics, for example), which makes possible the reduction in size.

Figure 6A:
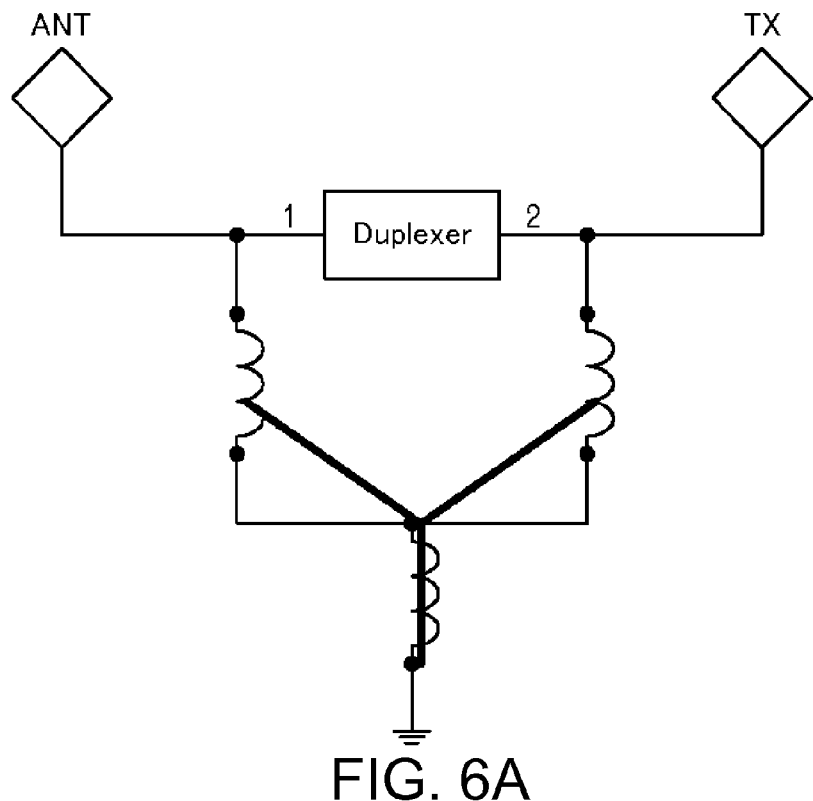
FIG. 6A is an explanatory diagram for Y-Δ conversion.
Figure 6B:
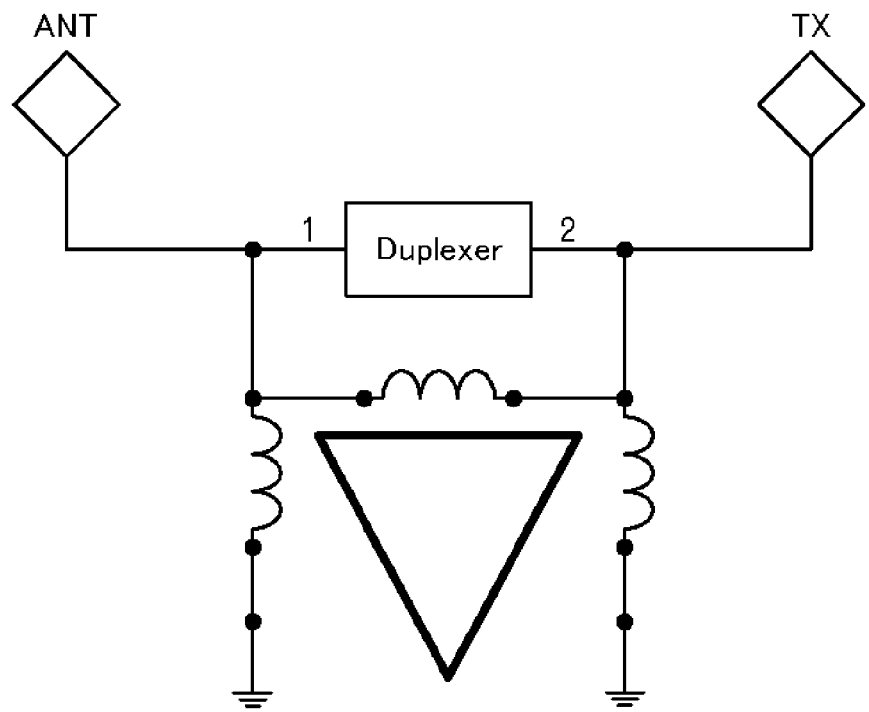
FIG. 6B is an explanatory diagram for Y-Δ conversion.
Figure 6C:
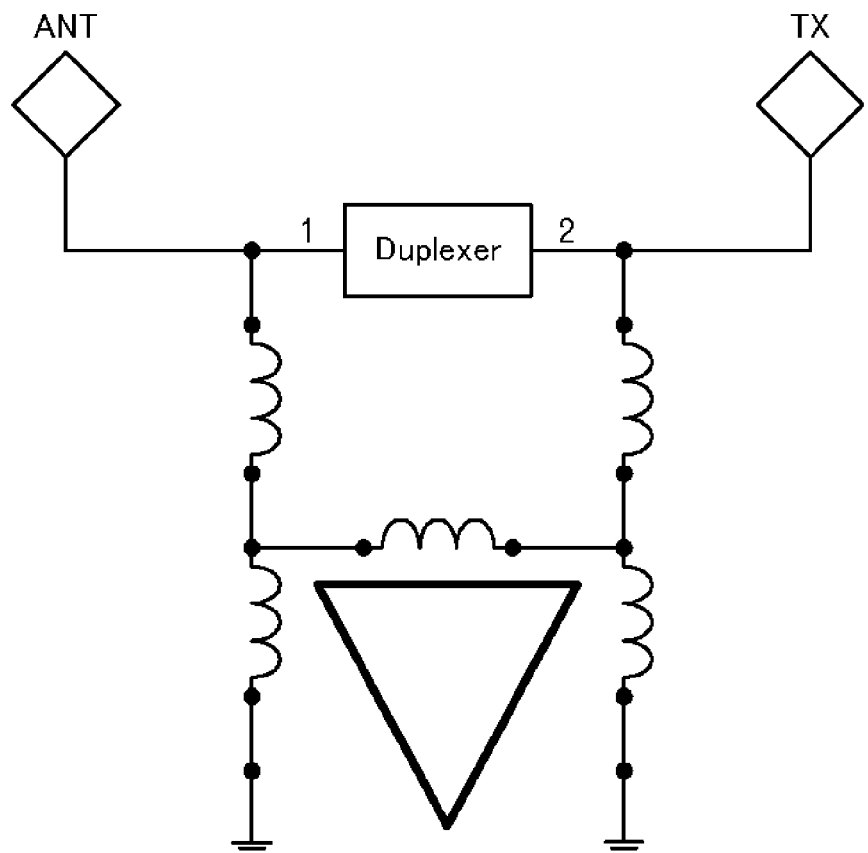
FIG. 6C is an explanatory diagram for Δ-Y conversion.
Figure 6D:
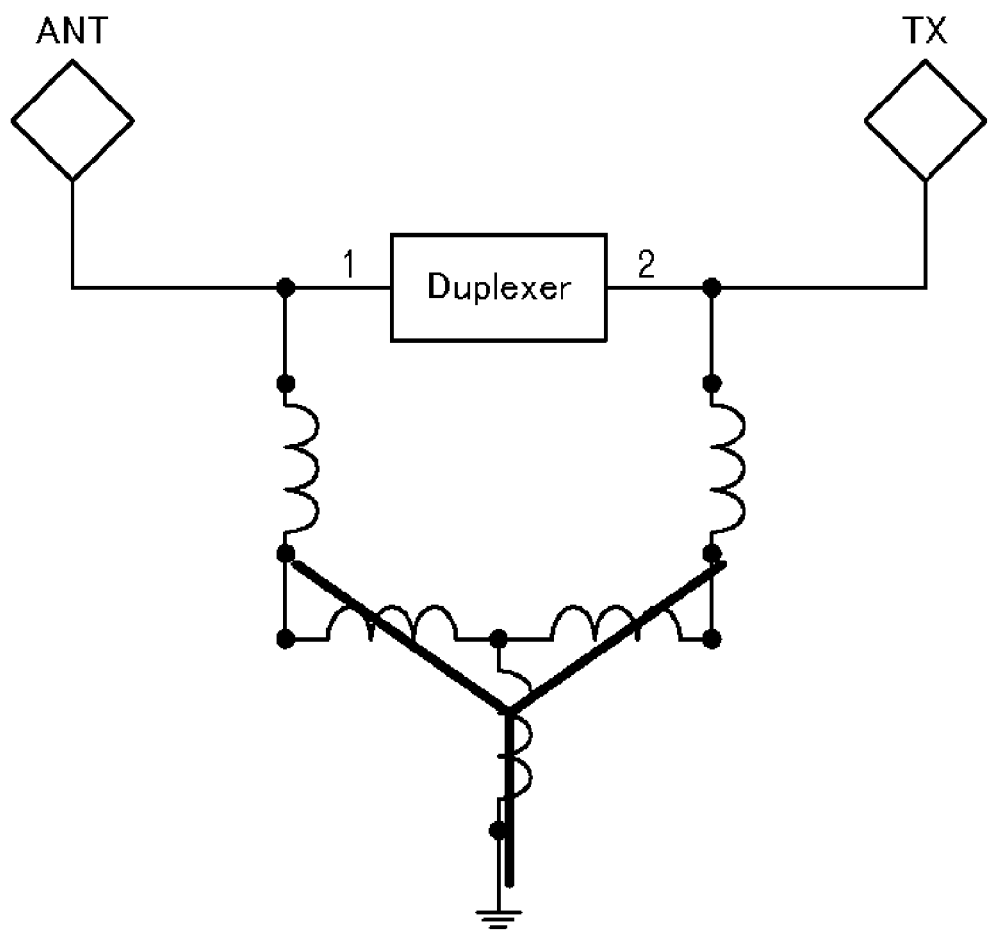
FIG. 6D is an explanatory diagram for Δ-Y conversion.

Techniques called the Y-Δ conversion and the Δ-Y conversion, which is the reverse thereof, are known. Using there conversions, the newly developed configuration of FIG. 5 can be shown to be substantially equivalent to the circuit shown in FIG. 3 in terms of circuit operations as follows. A circuit shown in FIG. 6A in which inductors are connected in the letter Y shape is an equivalent circuit of a circuit shown in FIG. 6B in which inductors are connected in a reverse Δ shape. Conversely, a circuit shown in FIG. 6C in which inductors are connected in a reverse Δ shape is an equivalent circuit of a circuit shown in FIG. 6D in which inductors are connected in the letter Y shape. The inductors in the circuit shown in FIG. 3 are connected in the same manner as those in FIG. 6B, and can thus be converted to the circuit shown in FIG. 6A. When the top two inductors in FIG. 6A are respectively divided into two inductors, the circuit shown in FIG. 6D can be obtained, and therefore, the circuit shown in FIG. 6A can be converted to the circuit shown in FIG. 6C, which is an equivalent circuit of the circuit shown in FIG. 6D. The circuit shown in FIG. 6C has the same configuration as that of the circuit in FIG. 5. It should be noted that the respective inductance values need to be calculated so as to obtain precise equivalent circuits. There are, of course, numerous ways to construct equivalent circuits of a particular circuit. Among such numerous possibilities, the present inventor has devised space-efficient and effective circuit configurations that make possible implementation into a small package.

Figure 7:
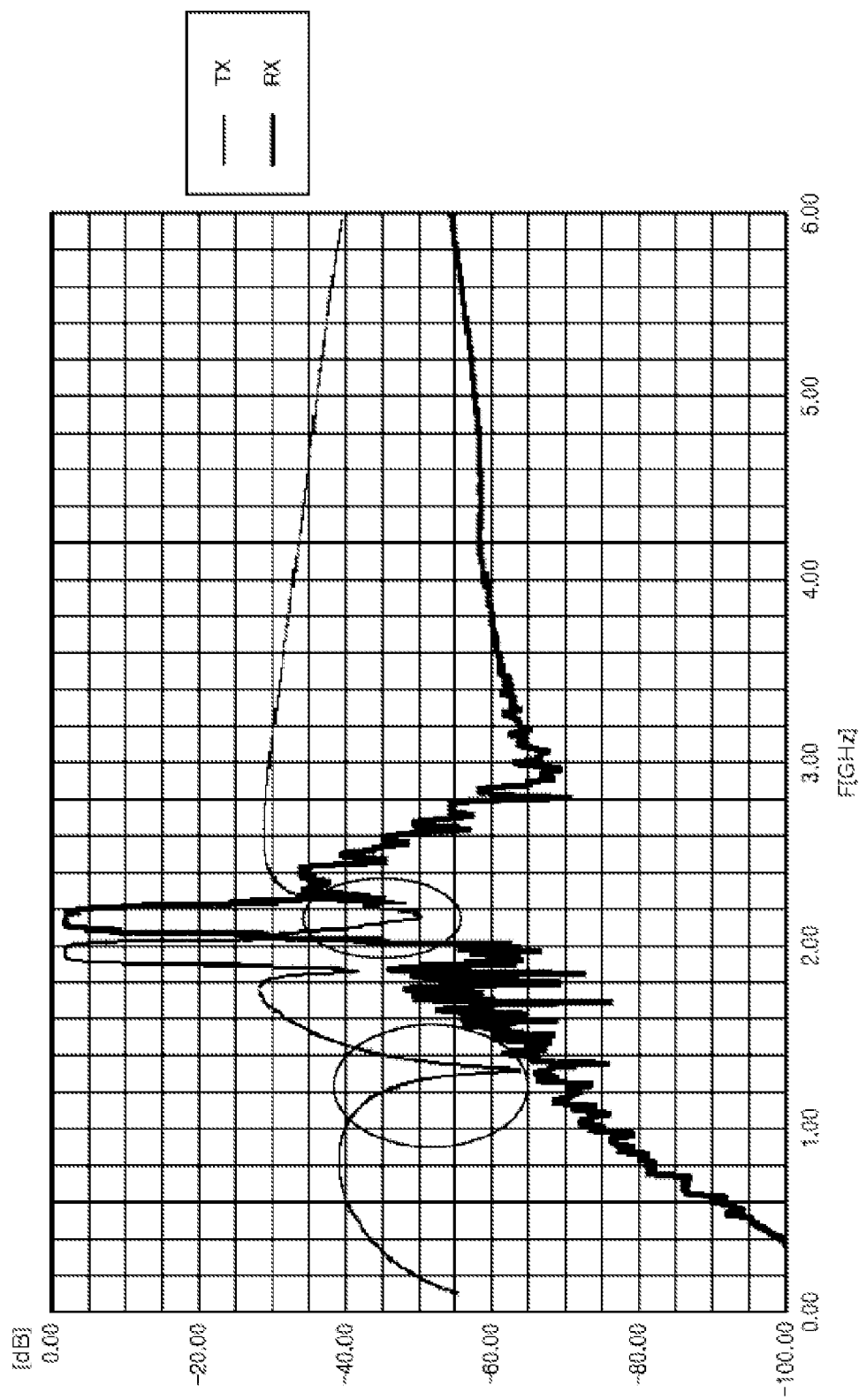
FIG. 7 shows the frequency characteristics of the circuit example of Embodiment 1.

FIG. 7 shows frequency characteristics of the circuit shown in FIG. 5. In FIG. 7, the frequency characteristics at the transmitting terminal (TX) and the frequency characteristics at the receiving terminal (RX) are shown. The horizontal axis represents the frequency, and the vertical axis represents the gain. Although these characteristics do not completely coincide with those of FIG. 4, the transmission frequency characteristics in the 1.5 GHz band and in the 2.11 GHz to 2.17 GHz band are sufficiently low as indicated with the circles in FIG. 7. That is, desired frequency characteristics can be obtained in the bands that are used for GPS and for wireless communication, respectively.

Figure 8:
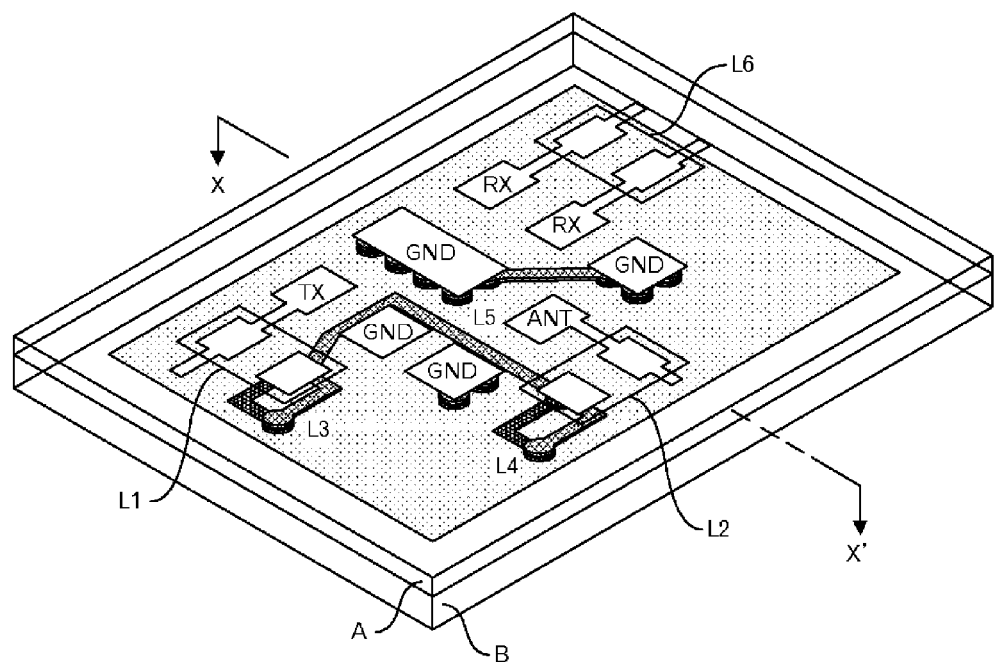
FIG. 8 is a perspective view showing a mounting example.

Next, an example of forming the inductors L3 to L5 inside the actual LTCC will be described. FIG. 8 is a perspective view of the substrate. The substrate includes an LTCC portion A and a printed circuit board portion B, and on a surface of the LTCC portion A, electrodes for the inductor L1, electrodes for the inductor L2, electrodes for the inductor L6, and eight electrodes for the SAW duplexer 101 are formed. Although the SAW duplexer 101 in FIG. 5 was shown to have six terminals, because additional two terminals are for grounding, the SAW duplexer 101 here is substantially the same as that in FIG. 5. As shown in the perspective view, inside the LTCC portion A, the inductor L3 is formed below the electrode for the inductor 1, the inductor L4 is formed below the electrode for the inductor L2, and the inductor L5 is formed by a line connecting the inductor L3 to the inductor L4.

Figure 9:
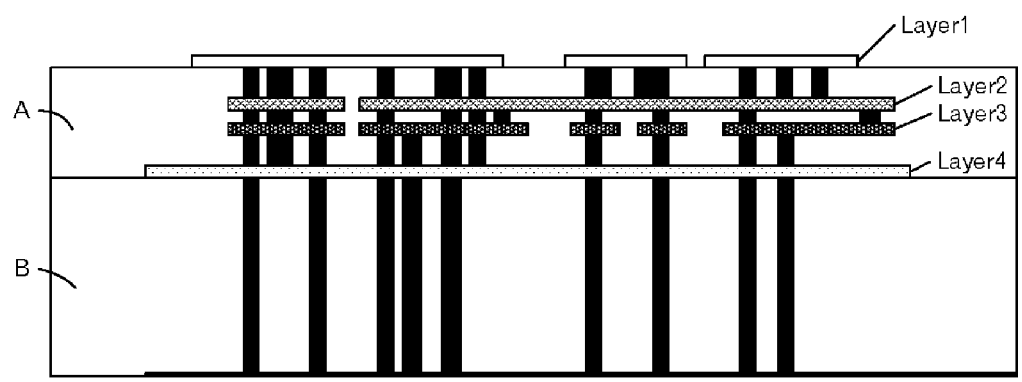
FIG. 9 is a cross-sectional view of a mounting substrate.

FIG. 9 is a cross-sectional view along the line XX' in FIG. 8. As shown in the figure, the LTCC portion A has four electrode layers. The vertical black portions are holes that connect different electrodes to each other. These electrode layers are represented as Layer 1, Layer 2, Layer 3, and Layer 4 from the top.

Figure 10:
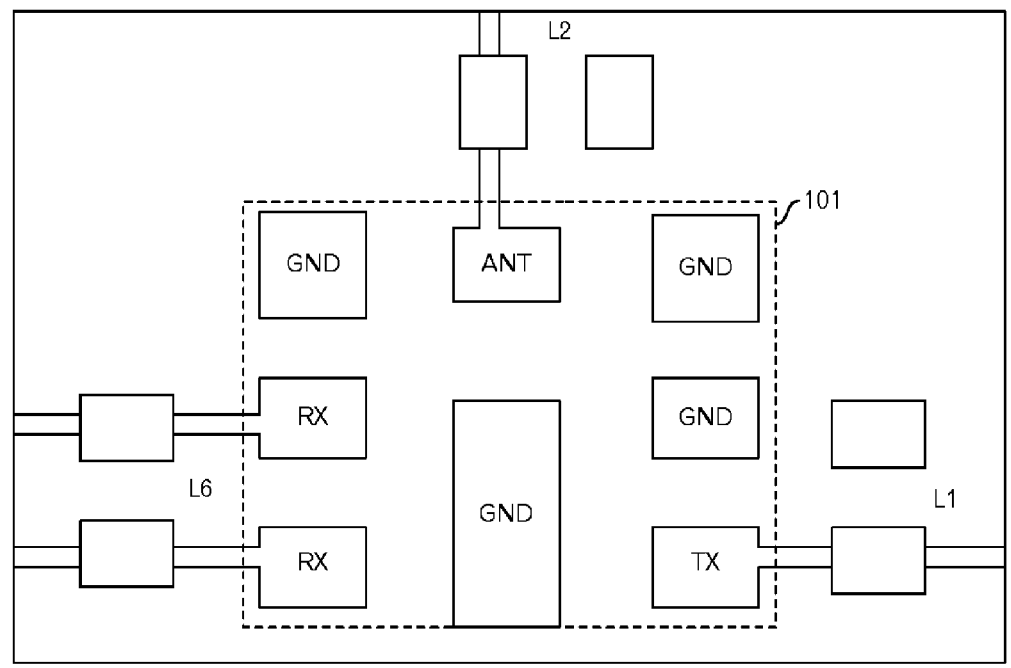
FIG. 10 shows the first layer of the substrate.

FIG. 10 shows Layer 1 that is the surface of the LTCC portion A. As also shown in FIG. 8, the eight electrodes for the SAW duplexer 101 and the respective electrodes for the inductor L1, the inductor L2, and the inductor L6 are formed in Layer 1.

Figure 11:
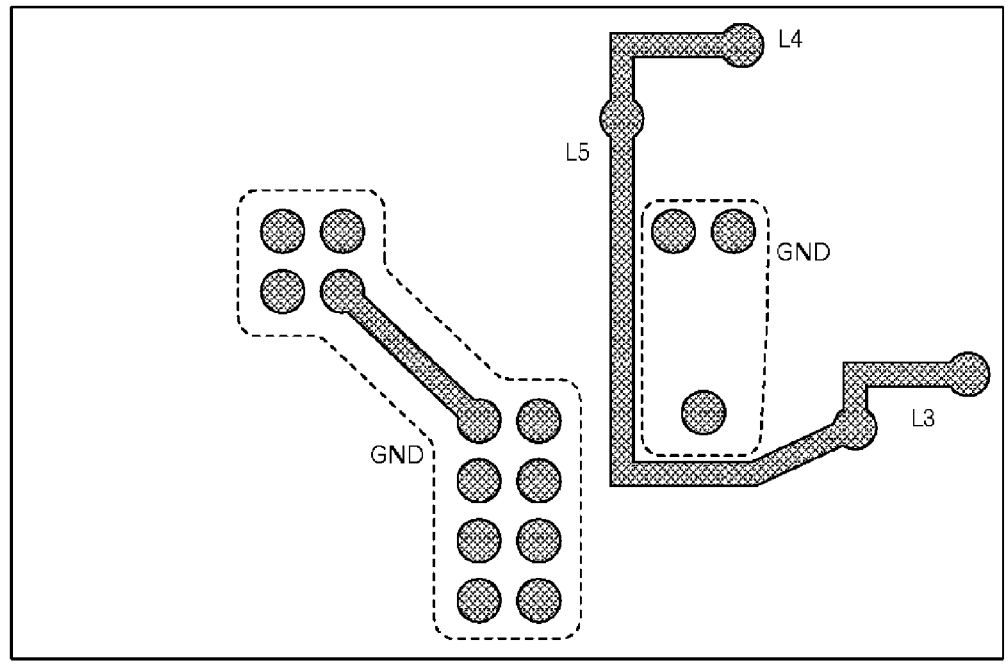
FIG. 11 shows the second layer of the substrate.

FIG. 11 shows Layer 2 inside the LTCC portion A. In Layer 2, a part of the inductor L4, a part of the inductor L3, and the entire inductor L5 that connects the inductor L3 to the inductor L4 are formed.

Figure 12:
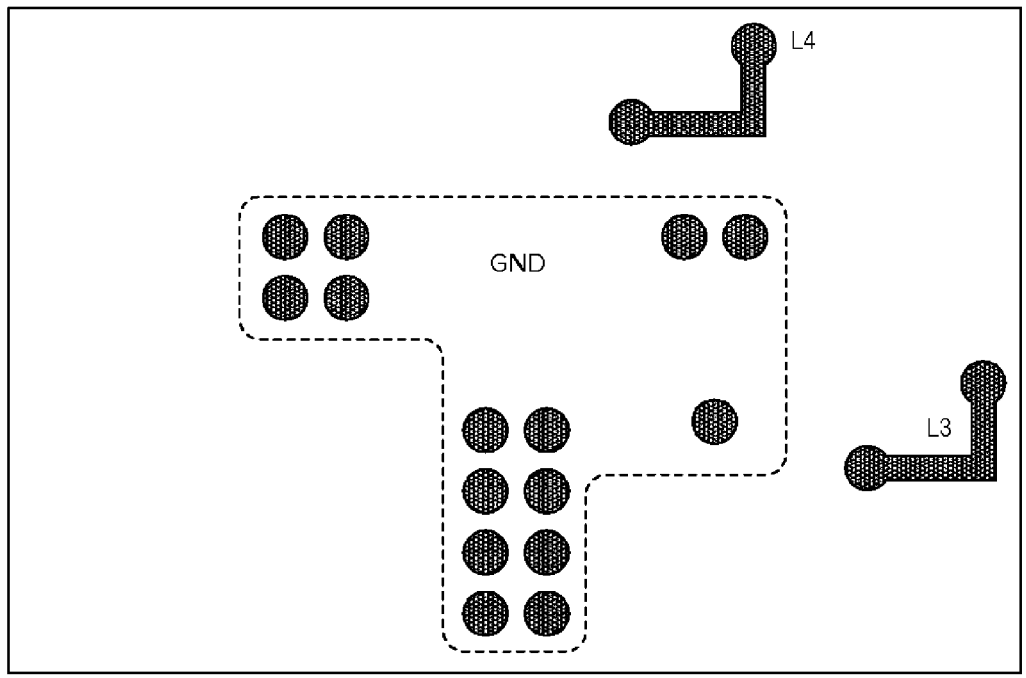
FIG. 12 shows the third layer of the substrate.

FIG. 12 shows Layer 3 inside the LTCC portion A. In Layer 3, ground sections, a part of the inductor L4, and a part of the inductor L3 are formed.

Figure 13:
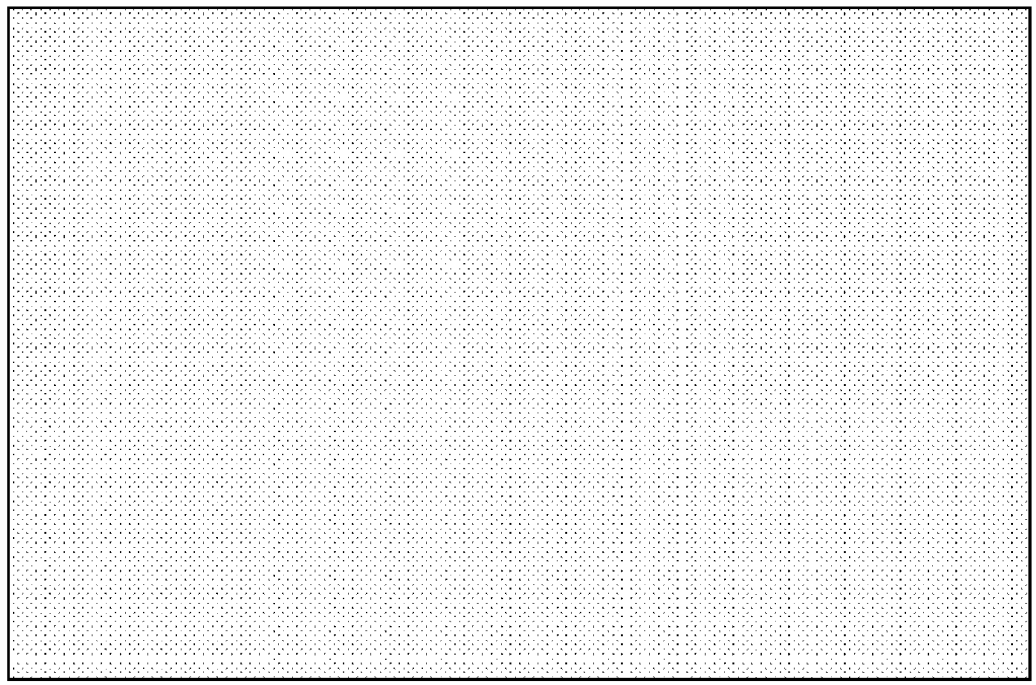
FIG. 13 shows the fourth layer of the substrate.

FIG. 13 shows Layer 4 inside the LTCC portion A. The entire Layer 4 is a ground layer.

As described above, because the inductor L3, the inductor L4, and the inductor L5 are formed inside the LTCC, the reduction in size of the front end module can be made possible.

Embodiment 2

Figure 14:
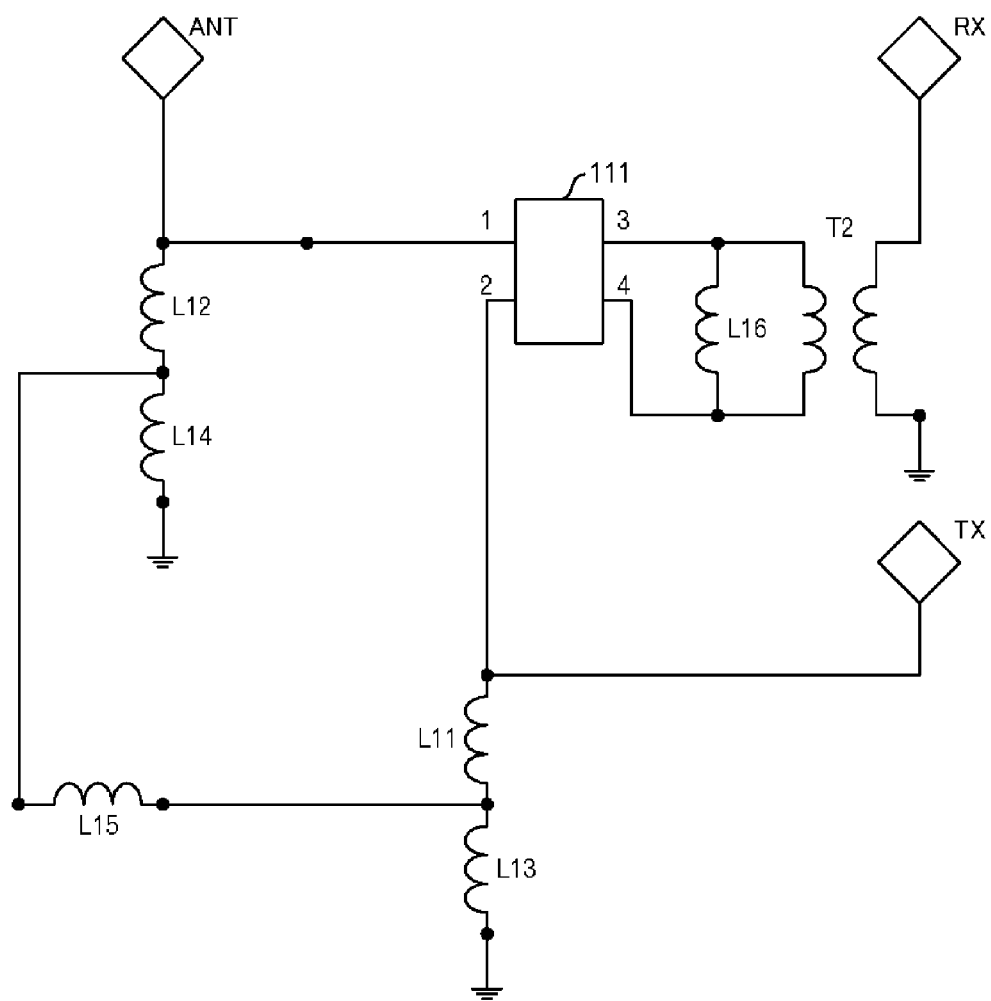
FIG. 14 shows a circuit example of Embodiment 2.

The inductance values of the inductors used in the circuit shown in FIG. 5 are set in accordance with the characteristics of the SAW duplexer 101. Therefore, when another SAW duplexer 111 is used, different inductors need to be used. FIG. 14 shows a circuit example of a front end module of the present embodiment. The basic circuit configuration is similar to that of FIG. 5. In FIG. 14, an inductor L11 (4.7 nH, for example) replacing the inductor L1, an inductor L12 (2.8 nH, for example) replacing the inductor L2, an inductor L13 (0.5 nH, for example) replacing the inductor L3, an inductor L14 (0.3 nH, for example) replacing the inductor L4, an inductor L15 (0.9 nH, for example) replacing the inductor L5, and an inductor L16 (8 nH, for example) replacing the inductor L6 are used.

Figure 15:
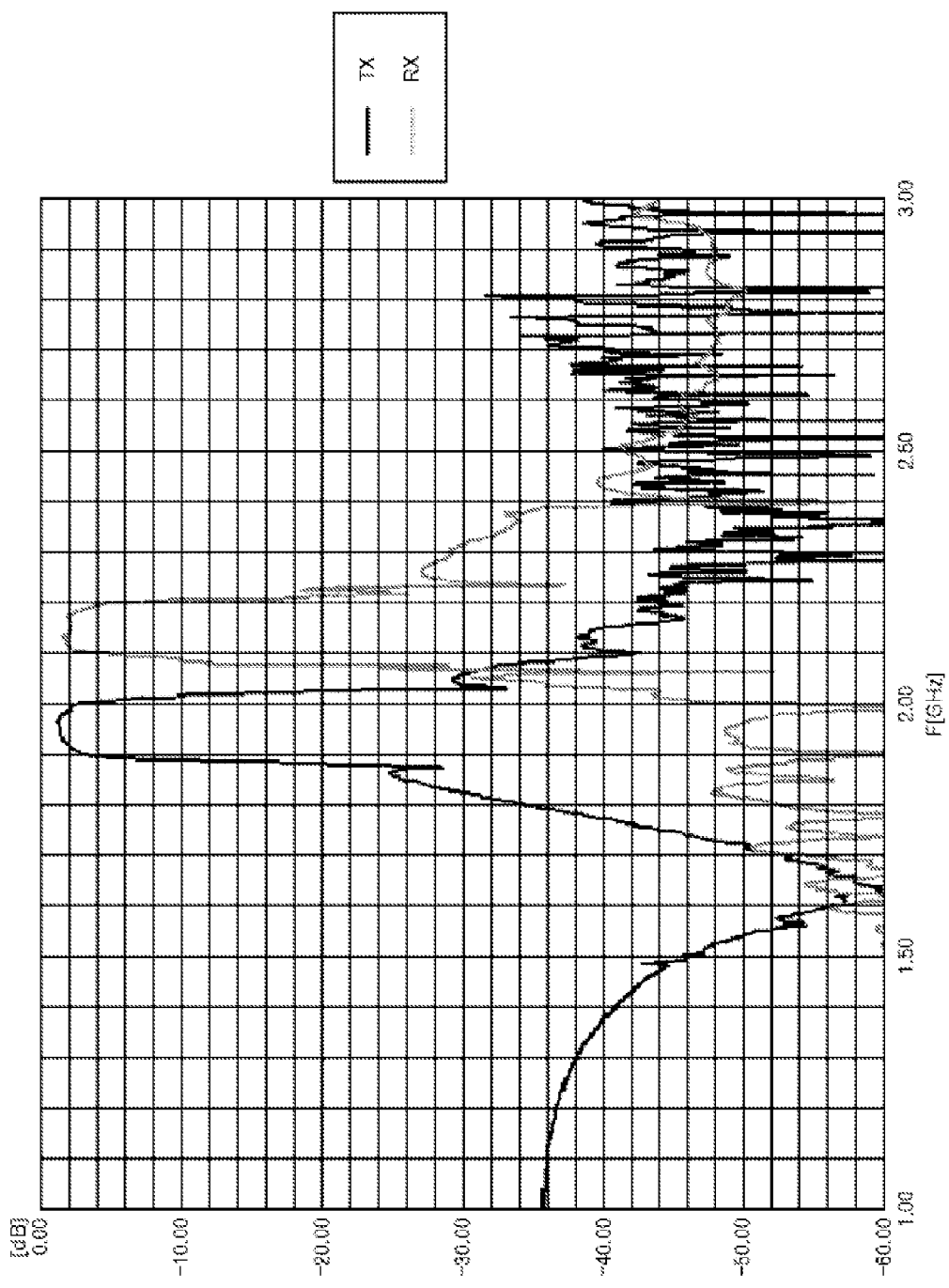
FIG. 15 shows the frequency characteristics of the circuit example of Embodiment 2.

FIG. 15 shows frequency characteristics of the circuit shown in FIG. 14. In FIG. 15, the frequency characteristics at the transmitting terminal (TX) and the frequency characteristics at the receiving terminal (RX) are shown. The horizontal axis represents the frequency, and the vertical axis represents the gain. In the frequency characteristics shown in FIG. 15, the sufficiently large attenuation amount is obtained around the 2.11 GHz to 2.17 GHz band, thus causing no adverse effect to the receiving circuit in wireless communication. On the other hand, around the 1.5 GHz band for GPS, although the attenuation amount is large in the vicinity thereof, the frequency at which the attenuation amount reaches its peak is slightly off from 1.5 GHz. One may consider adjusting the inductance values of the inductors in a manner similar to Embodiment 1 in order to change the peak frequency, but instead, the following modifications are made in the present embodiment.

Figure 16:
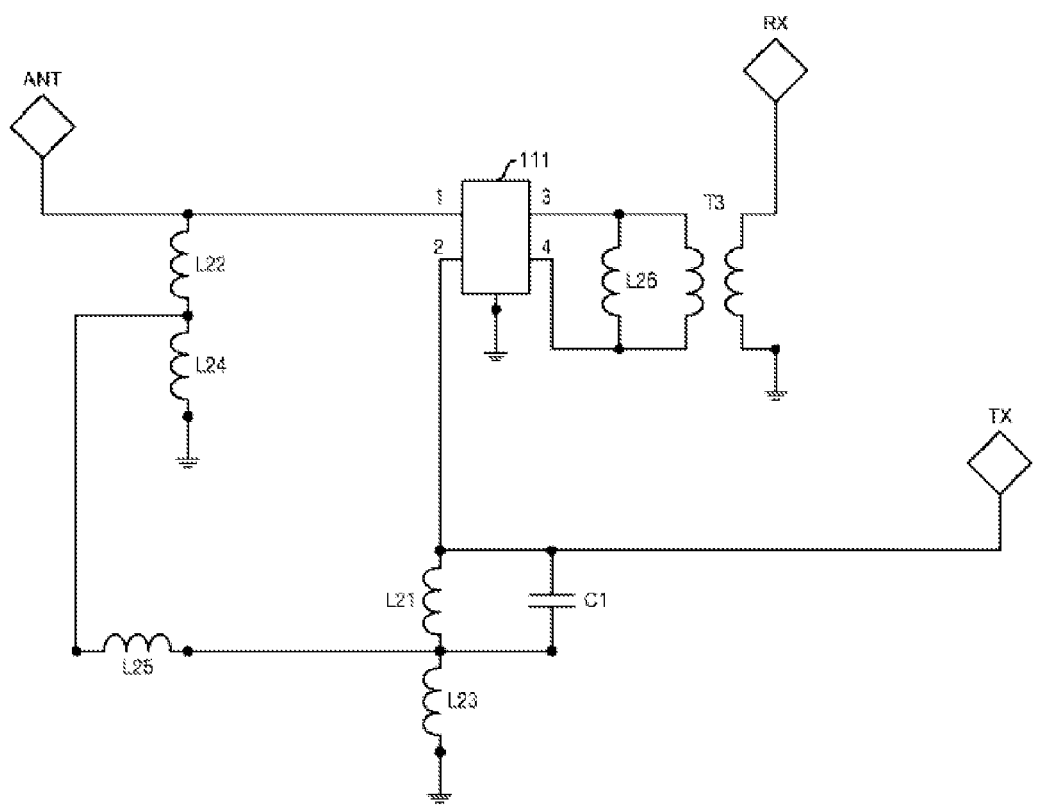
FIG. 16 shows a modification example of Embodiment 2.

FIG. 16 shows a circuit after modification. One end of an inductor L22 (2.8 nH, for example) is connected to a terminal 1 of the SAW duplexer 111, which is connected to an antenna (ANT), and the other end of the inductor L22 is connected to one end of an inductor L25 (0.9 nH, for example) and one end of an inductor L24 (0.3 nH, for example). The other end of the inductor L24 is grounded.

Also, one end of an inductor L21 (4.7 nH, for example) and one end of a capacitor C1 (0.3 pF, for example) are connected to a terminal 2 of the SAW duplexer 111, which is connected to the transmission circuit. The other end of the inductor L21 and the other end of the capacitor C1 are connected to the other end of the inductor L25 and one end of an inductor L23 (0.5 nH, for example). The other end of the inductor L23 is grounded. That is, the inductor L21 and the capacitor C1 are connected in parallel.

Between a terminal 3 and a terminal 4 of the SAW duplexer 111, which are connected to the receiving circuit, an inductor L26 (8 nH, for example) and the primary coil of a transformer T3 are connected in parallel. One end of the secondary coil of the transformer T3 is grounded, and the other end thereof is connected to another circuit.

Figure 17:
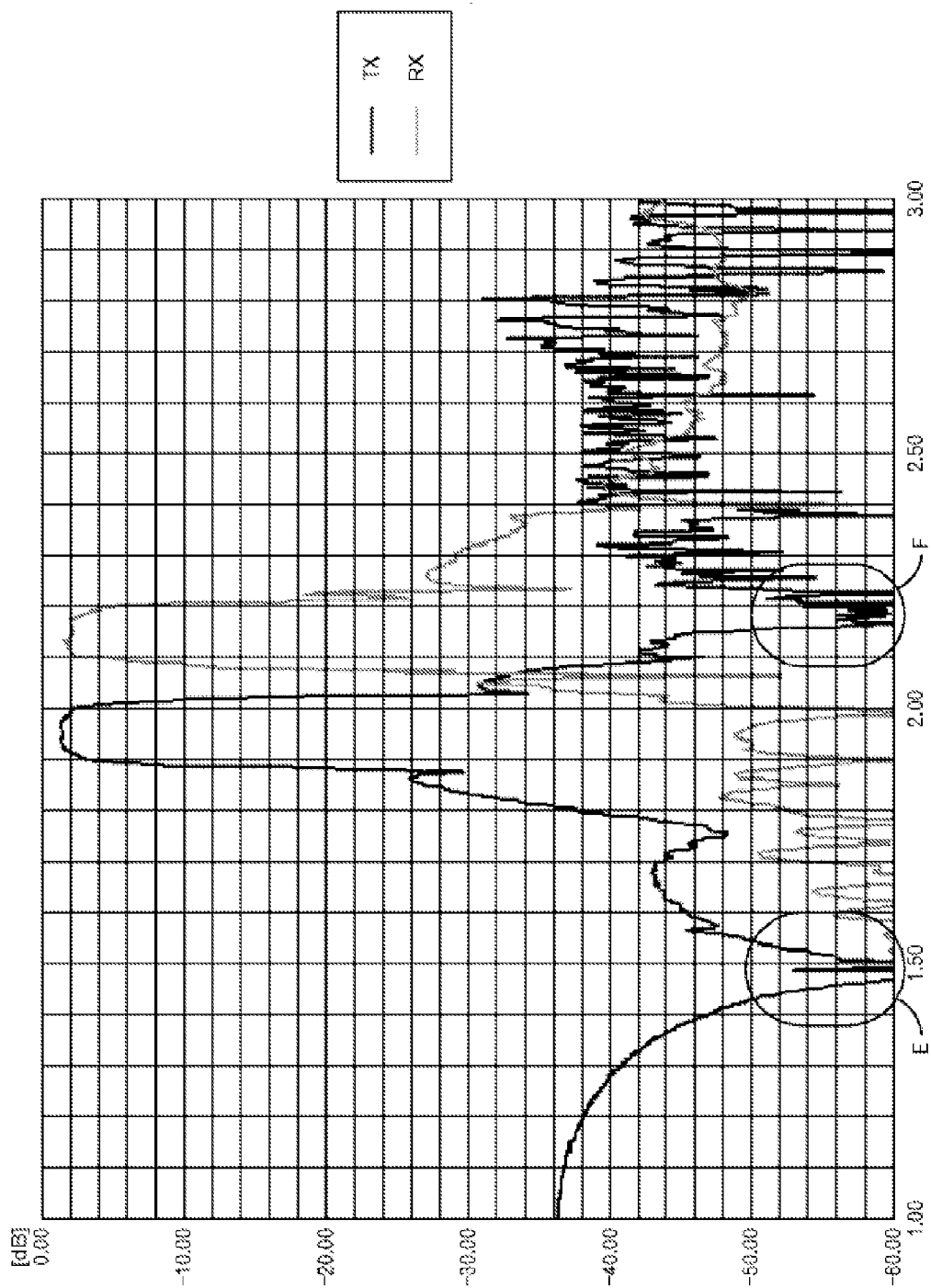
FIG. 17 shows the frequency characteristics of the modification example of Embodiment 2.

When the capacitor C1 is provided as described above, frequency characteristics shown in FIG. 17 are obtained. In FIG. 17, the frequency characteristics at the transmitting terminal (TX) and the frequency characteristics at the receiving terminal (RX) are shown. The horizontal axis represents the frequency, and the vertical axis represents the gain. As indicated with E and F in FIG. 17, the sufficient attenuation amount is ensured around the 1.5 GHz band for GPS and around the 2.11 GHz to 2.17 GHz band for receiving the wireless communication. This modification is particularly effective for the 1.5 GHz band, but because the characteristics around the 2.11 GHz to 2.17 GHz band are also changed as compared with those in FIG. 15, the capacitance value of the capacitor C1 need to be adjusted so as to obtain the desired frequency characteristics in both bands.

Figure 18:
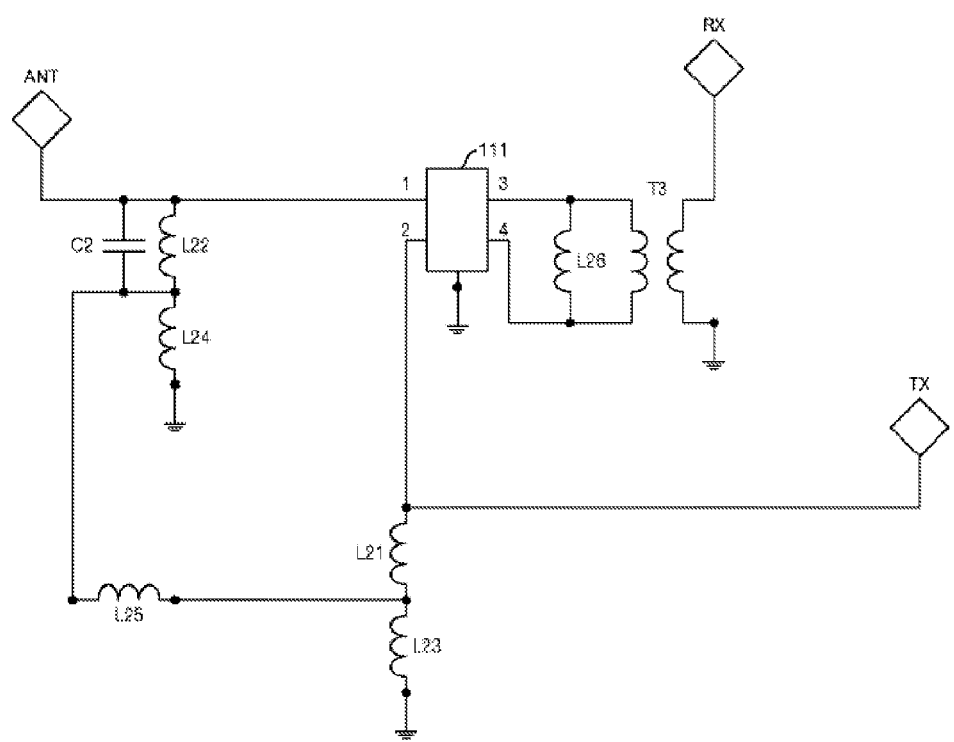
FIG. 18 shows the second modification example of Embodiment 2.
Figure 19:
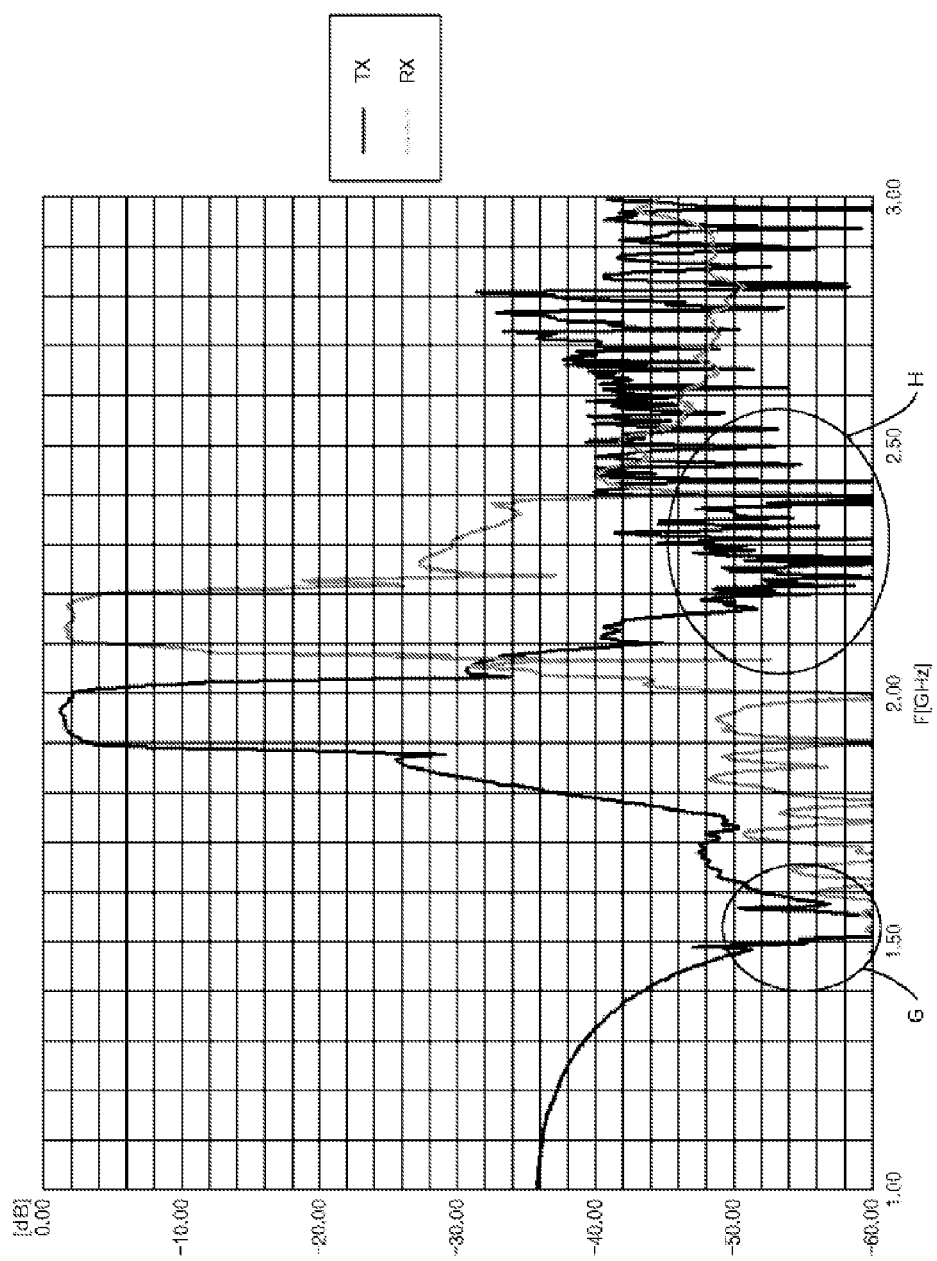
FIG. 19 shows the frequency characteristics of the second modification example of Embodiment 2.

Because the inductors are connected in the letter H shape, and are symmetrical, it is also possible to connect a capacitor C2 in parallel with the inductor L22 as shown in FIG. 18, instead of connecting the capacitor C1 in parallel with the inductor L21. In this case, the frequency characteristics shown in FIG. 19 are obtained. As indicated with the circles G and H in FIG. 19, the frequencies at which the attenuation amount reaches its peak are different from those in the frequency characteristics shown in FIG. 17. By changing the capacitance of the capacitor C2, the frequencies at which the attenuation amount reaches its peak can be adjusted.

Figure 20:
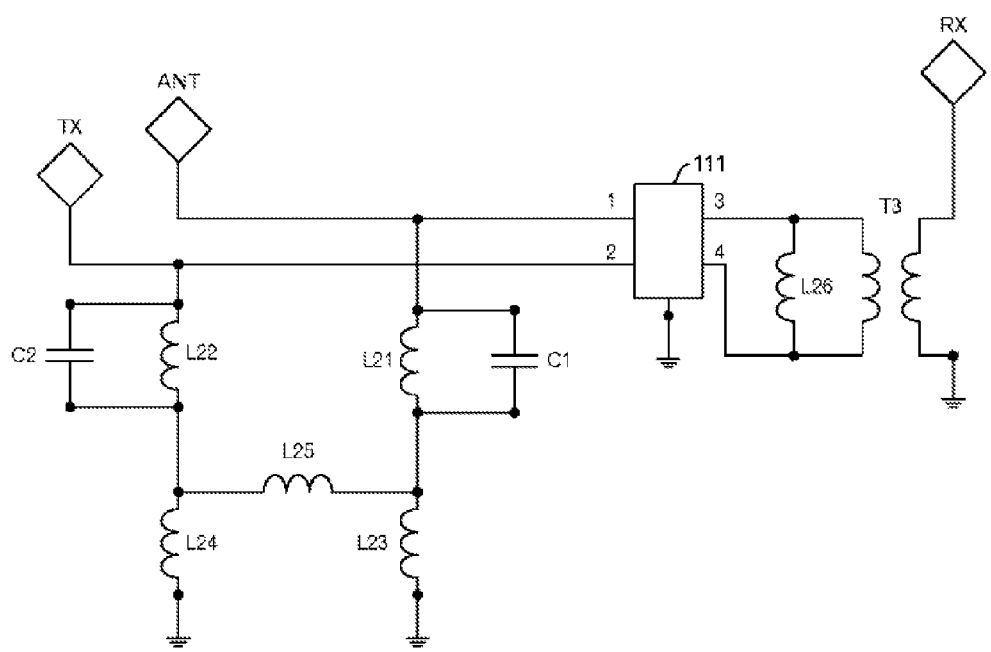
FIG. 20 shows the third modification example of Embodiment 2.
Figure 21:
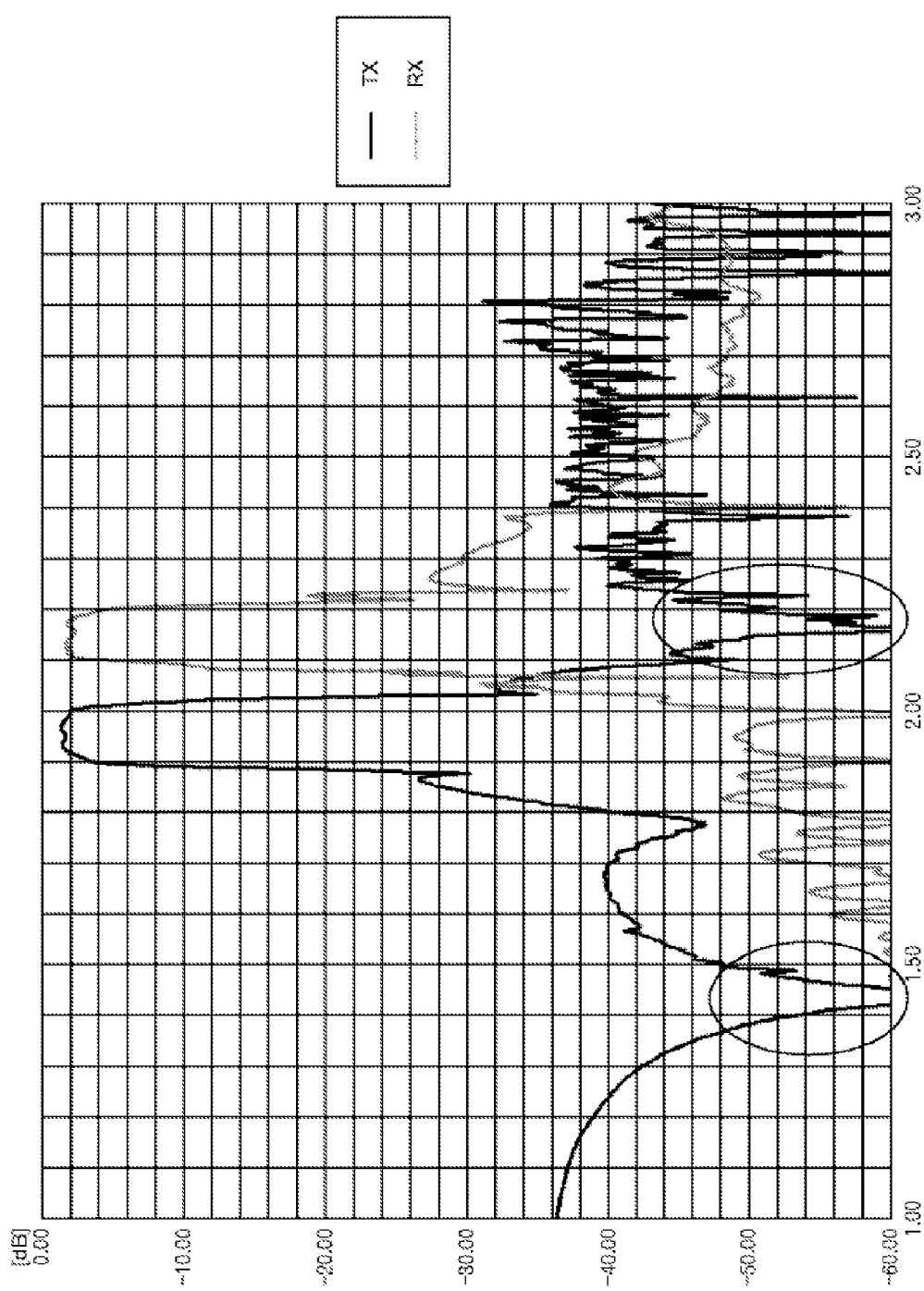
FIG. 21 shows frequency characteristics of the third modification example of Embodiment 2.

Further, as shown in FIG. 20, it is also possible to connect the capacitor C1 in parallel with the inductor L21 and connect the capacitor C2 in parallel with the inductor L22. In this case, the frequency characteristics shown in FIG. 21 are obtained. In a manner similar to FIG. 17, in FIG. 21, the sufficient attenuation amount can be ensured in the desired frequency bands (as indicated with the circles in FIG. 21). As described above, by changing the capacitance of the capacitors C1 and C2, the frequencies at which the attenuation amount reaches its peak can be adjusted. The capacitors C1 and C2 can be integrally formed within the LTCC portion or provided externally using conventional technologies.

The embodiments of the present invention were described above, but the present invention is not limited to such, and it is possible to modify the circuits in such a manner to provide for effects similar to those of the embodiments above.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A substrate structure for a filter circuit, comprising
a substrate;
a first terminal on the substrate to be connected to the filter and an antenna;
a second terminal on the substrate to be connected to the filter and a receiving circuit;
a third terminal on the substrate to be connected to the filter and a transmission circuit;
a first inductor, a second inductor, and a third inductor, the first, second, and third inductors being connected in series, forming a serial chain of the first to third inductors, between the first terminal and the third terminal, one end of said serial chain of the first to third inductors being directly connected to the first terminal and another end of said serial chain of the first to third inductors being directly connected to the third terminal, the second inductor being provided in the substrate, the first and third inductors being provided on the substrate;
a fourth inductor in the substrate, the fourth inductor having one end connected to a connecting node connecting the first inductor to the second inductor, and having the other end grounded; and
a fifth inductor in the substrate, the fifth inductor having one end connected to a connecting node connecting the second inductor to the third inductor, and having the other end grounded.

2. The substrate structure according to claim 1, wherein the substrate is a ceramic substrate.

3. The substrate structure according to claim 1, wherein the substrate includes a ceramic substrate and a printed circuit board under the ceramic substrate, and
wherein the second, fourth, and fifth inductors are formed in the ceramic substrate.

* * * * *